US006298413B1

(12) United States Patent
Christenson

(10) Patent No.: US 6,298,413 B1
(45) Date of Patent: Oct. 2, 2001

(54) APPARATUS FOR CONTROLLING REFRESH OF A MULTIBANK MEMORY DEVICE

(75) Inventor: Leonard E. Christenson, Coon Rapids, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/196,571

(22) Filed: Nov. 19, 1998

(51) Int. Cl.[7] .............................. G06F 12/00; G11C 7/00
(52) U.S. Cl. ............................ 711/106; 711/5; 711/168
(58) Field of Search .................................... 711/106, 150, 711/209, 168, 104, 5, 100; 365/222, 230.03

(56) References Cited

U.S. PATENT DOCUMENTS

| 4,796,232 | 1/1989 | House | 365/189 |
|---|---|---|---|
| 4,818,932 | * 4/1989 | Odenheimer | 324/121 |
| 5,627,791 | * 5/1997 | Wright et al. | 365/222 |
| 5,636,173 | 6/1997 | Schaefer | 365/230.03 |
| 5,796,669 | 8/1998 | Araki et al. | 365/222 |
| 5,907,857 | 5/1999 | Biswas | 711/106 |
| 5,920,898 | * 7/1999 | Bolyn et al. | 711/167 |
| 5,940,342 | 8/1999 | Yamazaki et al. | 365/230.03 |
| 6,000,007 | 12/1999 | Leung et al. | 711/105 |
| 6,018,793 | * 1/2000 | Rao | 711/150 |
| 6,046,953 | 4/2000 | Kiehl et al. | 365/222 |
| 6,075,744 | 6/2000 | Tsern et al. | 365/230.03 |
| 6,134,169 | 10/2000 | Tanaka | 365/222 |

* cited by examiner

Primary Examiner—Tuan V. Thai
(74) Attorney, Agent, or Firm—Dorsey & Whitney LLP

(57) ABSTRACT

An apparatus is described for controlling refresh of a multibank DRAM. A memory controller includes refresh request circuitry having a refresh counter and address incrementer. The refresh counter produces a refresh request signal, with the address incrementer producing an associated refresh address. The refresh request and address are handled much like a memory read operation, with the associated read data being ignored. In one implementation, the refresh request is given priority over any other pending memory access request. Refresh operations are initiated without first waiting for all DRAM banks to be precharged, thereby avoiding the significant time penalties associated with the prior art.

26 Claims, 6 Drawing Sheets

APPARATUS FOR CONTROLLING REFRESH OF A MULTIBANK MEMORY DEVICE

TECHNICAL FIELD

The present invention relates generally to circuitry and protocols associated with operating a memory device, and more particularly, to apparatus for controlling refresh operations in a dynamic random access memory device.

BACKGROUND OF THE INVENTION

FIG. 1 is a simplified functional block diagram of a memory device 200 that represents any of a wide variety of currently available memory devices. The central memory storage unit is a memory array 202 that is arranged in a plurality of banks, with two such banks 204A and 204B shown. The memory array 202 includes a plurality of individual memory elements (not shown) for storing data, with the memory elements commonly arranged in separately addressable rows and columns, as is well known.

Particular locations within the memory array 202 are addressable by Address signals that external circuitry such as a memory controller (not shown) provides to the memory device 200. The memory controller also provides a plurality of Control or command signals that are used to designate the particular memory access type and/or sequence of memory accesses. As depicted in FIG. 1, a control/address logic circuit 206 receives the Control and Address signals, which may be provided in parallel signal paths, serially, or some suitable combination. The control/address logic circuit 206 then applies a plurality of internal control signals to control the timing and sequence of operations accessing the banks 204A and 204B via access circuits 208A and 208B, respectively. Those skilled in the art will understand that the depicted access circuits 208A and 208B represent a collection of various functional circuit components commonly found in memory devices. Examples include row and column address latch, buffer, and decoder circuits, sense amplifiers and I/O gating circuitry, and other well-known circuits adapted for particular memory device implementations.

Data written to and read from the memory array 202 is transferred from and to the memory controller or other external circuitry via a data I/O circuit 210 and the access circuits 208A and 208B. Those skilled in the art will also understand that the depicted data I/O circuit 210 represents a collection of various functional circuit components adapted to transmit data to or receive data from external circuitry and to correspondingly receive read data from or transmit write data to the array 202 via the access circuits 208A and 208B.

As known to those skilled in the art, data stored in dynamic random access memories (DRAMs) deteriorates with time and must be periodically "refreshed" to maintain accurate data. The control/address logic circuit 206 then includes a refresh control/address circuit 212 that provides the necessary control signals and address information to refresh the data contents of the array 202. Operation of the refresh control/address circuit 212 is commonly initiated in response to a command from the memory controller, such as the well known Auto Refresh command.

The memory device 200 depicted in FIG. 1 exemplifies multibank DRAMs, such as synchronous DRAMs (SDRAMs) and packet-oriented DRAMs (known as SLDRAMs). SDRAMs commonly have two array banks, and SLDRAMs commonly have eight array banks. Providing multiple banks improves the average speed with which a sequence of memory operations can be performed. When access to a particular array bank is complete, a "precharge" operation is performed to prepare the corresponding access circuitry for a subsequent data transfer operation with the array bank. The precharge operation requires a certain amount of time for its completion, and therefore limits the speed with which a sequence of memory operations can be performed to a particular array bank. By organizing the memory array to have multiple banks with associated access circuits, the precharge time can, in some instances, be "hidden." For example, if a first access is to bank 204A and a subsequent access is to bank 204B, precharge operations associated with bank 204A can occur while initiating memory access operations to bank 204B.

Initiation of Auto Refresh operations cannot occur, however, until the memory device 200 is idle—namely, no memory operations are occurring and all array banks and associated access circuits have been precharged. Thus, while providing a multiple bank configuration can improve data transfer speeds for some sequences of memory operations, refresh operations still adversely effect data transfer rates.

Referring to FIG. 2, a timing diagram depicts the operation of an SLDRAM in accordance with the prior art. As is known to those skilled in the art, control and address information is provided to the SLDRAM as a sequence of packets, each of which is registered at a clock "tick" (a rising or falling edge of a command clock signal). The timing diagram depicts commands provided as a sequence of four packets of control/address information CA0–CA9. The commands are registered at times referenced to the command clock signal CCLK, and the data input to or output from the SLDRAM is a sequence of four packets of data DQ0–DQ17.

Referring to FIG. 2, a first command is registered during a 10 nanosecond time interval. The first registered command is a bank read and close command addressed to a location in a bank0. Following the bank read time interval tBR (also known as read latency), data read from bank0 is then delivered as a sequence of four data packets. The well-known open-to-close row command period tRAS and precharge time period tRP are also shown. Because all access to the SLDRAM must cease prior to conventional refresh operations, the four packet Auto Refresh command registration is limited by the open-to-close row and precharge time intervals, as shown. Following registration of the Auto Refresh command, further command registration is limited by the refresh command period tRC. Only then can a subsequent access be initiated, such as the depicted read and close operation to a location in a bank2. As shown in FIG. 2, conventional refresh operations in an SLDRAM result in a significant time lapse between registration of successive read commands. Multibank DRAM refresh operations in accordance with the prior art significantly and adversely affect the speed at which consecutive data transfer operations can be performed.

SUMMARY OF THE INVENTION

In accordance with the invention, a memory controller is provided for controlling operations of a multibank memory. The memory controller includes a request buffer, a refresh requester, and a control state machine. The request buffer stores a pending data transfer request, and the refresh requester produces a refresh request. The control state machine is coupled with the request buffer, and responds to receiving the data transfer request by applying a first set of control signals to the memory to initiate data transfer operations. The control state machine is also coupled with the refresh requester, and responds to receiving the refresh request by applying a second set of control signals to the memory to initiate refresh operations. The control state machine initiates refresh operations addressed to a first of the banks while data transfer operations are being executed in a second of the banks. The memory controller may also include a request arbiter coupling the control state machine with the request buffer and with the refresh requester, with the request arbiter selectively transmitting either the data transfer request or the refresh request to the control state machine.

In one aspect of the invention, a memory controller is provided for controlling operations of a multibank memory that registers commands and requires a minimum command time interval between successive registration of commands addressed to the same bank. The memory controller includes request buffer circuitry, refresh request circuitry, and control state circuitry. The data transfer request circuitry stores at least one data transfer request and provides this request to the control state circuitry. The refresh request circuitry provides a refresh request to the control state circuitry. The control state circuitry registers commands in the multibank memory, including first and second commands associated with requests received from the data transfer request buffer and the refresh request circuitry, respectively. The control state circuitry registers the second command before elapse of the command time interval from registration of the first command.

In another aspect of the invention, a computer system is provided that includes a memory controller coupling a processor with a multibank memory. The memory controller is able to initiate a refresh operation directed to a first of the banks while a data transfer request is being executed in a second of the banks. The memory may be an SDRAM or an SLDRAM. The memory controller may include a request queue and a refresh request circuit, with the request queue for storing a plurality of pending data transfer requests. The refresh request circuit may include a timing circuit and an address circuit. The timing circuit determines the time at which the refresh operation is initiated, and the address circuit provides an address of a location in the first bank to which the refresh operation is directed.

DETAILED DESCRIPTION OF THE INVENTION

The following describes a novel apparatus for controlling refresh operations of a dynamic random access memory device included in, for example, a computer system. Certain details are set forth to provide a sufficient understanding of the present invention. However, it will be clear to one skilled in the art that the present invention may be practiced without these particular details. In other instances, well-known circuits, control signals, timing protocols, and software operations have not been shown in detail in order to avoid unnecessarily obscuring the invention.

Figure 3:
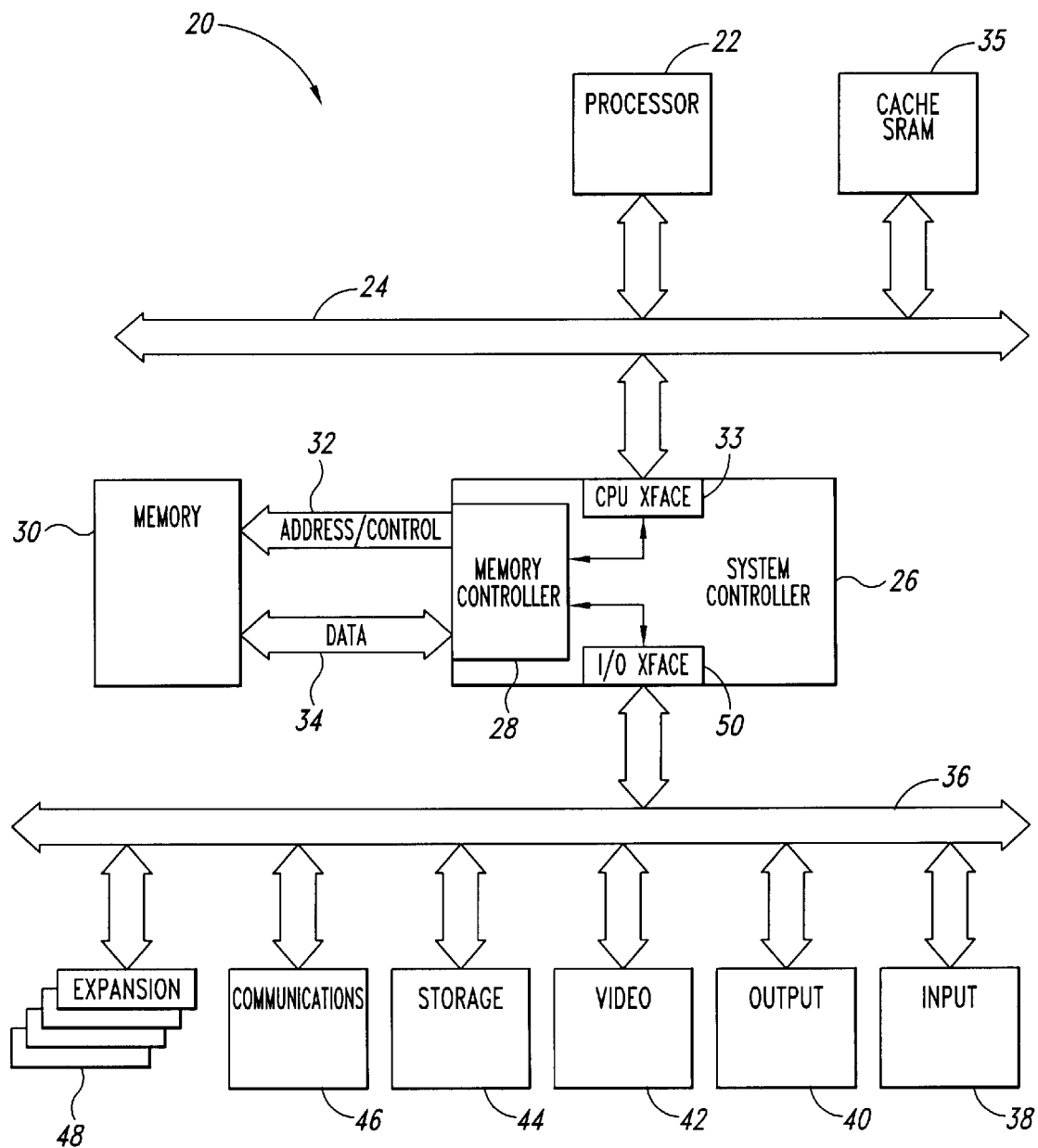
FIG. 3 is a functional block diagram of a computer system in accordance with an embodiment of the present invention.

FIG. 3 shows a computer system 20 in accordance with an embodiment of the present invention. The central processing unit (CPU), such as a microprocessor 22, is coupled with a system controller 26 (also known as corelogic) by a host or processor bus 24 that carries address, data, and control signals therebetween. The system controller 26 includes a memory controller 28 for accessing a main memory 30 via a memory address/control bus 32 and a memory data bus 34. The microprocessor 22 may be any of a wide variety of processors, such as Pentium-type processors manufactured by Intel or other x86-type architecture processors manufactured by AMD, Cyrix, and others. The main memory may include any of a wide variety of multibank DRAMs. Examples include DRAMs manufactured by Micron Technology, Inc., such as SDRAMs, SLDRAMs, etc. If the main memory 30 is populated by SDRAMs, the address/control bus 32 would typically be implemented as separate address and control buses, as is well known by those skilled in the art. If the main memory is populated by SLDRAMs, the address/control bus 32 is then a single bus adapted for transmission of command and address packets, as is well known to those skilled in the art.

The system controller 26 also includes CPU interface circuitry 33 that couples the microprocessor 22 with other components of the system controller, such as the memory controller 28. The system controller 26 also includes a cache controller (not shown) for controlling data transfer operations to a cache memory 35 that provides higher speed access to a subset of the information stored in the main memory 30. The cache memory 35 may include any of a wide variety of suitable high-speed memory devices, such as static random access memory (SRAM) modules manufactured by Micron Technology, Inc.

The system controller 26 also functions as a bridge circuit (sometimes called the host bus bridge or North bridge) between the processor bus 24 and a system bus, such as I/O bus 36. The I/O bus 36 may itself be a combination of one or more bus systems with associated interface circuitry (e.g., AGP bus and PCI bus with connected SCSI and ISA bus systems). Multiple I/O devices 38–46 are coupled with the I/O bus 36. Such I/O devices include a data input device 38 (such as a keyboard, mouse, etc.), a data output device 40 (such as a printer), a visual display device 42 (commonly coupled with the system controller 26 via a high-speed PCI or AGP bus), a data storage device 44 (such as a disk drive, tape drive, CD-ROM drive, etc.), and a communications device 46 (such as a modem, LAN interface, etc.). Additionally expansion slots 48 are provided for future accommodation of other I/O devices not selected during the original design of the computer system 20.

FIG. 3 depicts the various I/O devices 38–46 as being coupled with the controller via single, shared 110 bus 36 and an I/O interface 50 integrated within the system controller. However, those skilled in the art will understand that the depicted I/O interface 50 represents one or more I/O interfaces, as appropriate to a particular computer system design. Also, the I/O bus 36 may itself be a multiple bus and bridge network. Those skilled in the art will understand, therefore, that the depiction of FIG. 3 encompasses any of a wide variety of suitable interconnection structures between the I/O devices 38–46 and other components of the computer system 20. Likewise, the computer system 20 could include multiple processors with multiple host bus bridges and multiple memories with associated memory controllers. Therefore, those skilled in the art will understand the particular depiction of FIG. 3 to encompass any of a wide variety of computer system architectures.

Figure 4:
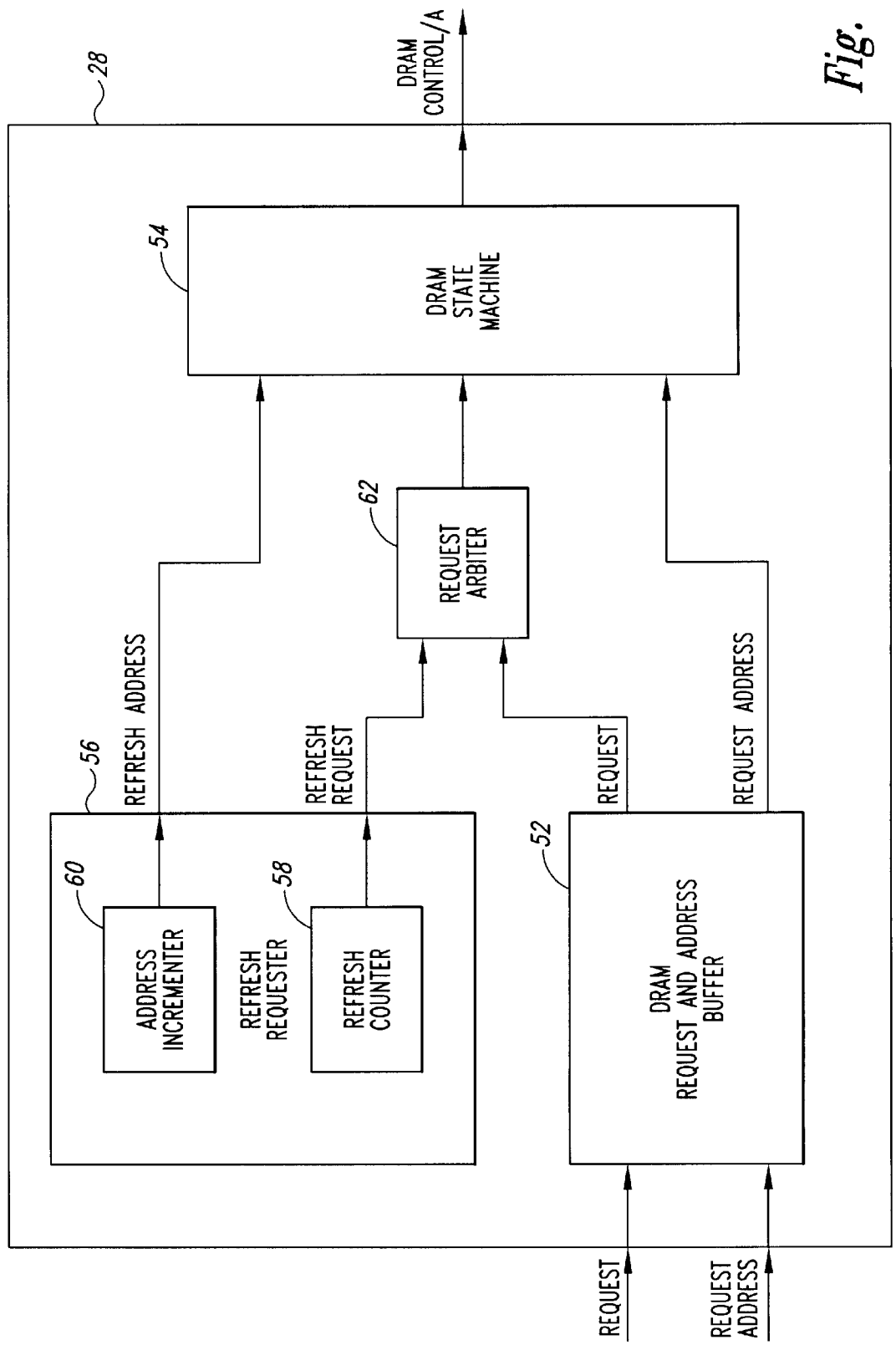
FIG. 4 is a functional block diagram depicting a memory controller included in the computer system of FIG. 3.

FIG. 4 is a functional block diagram depicting portions of the memory controller 28. The memory controller 28 receives a Request and associated Request Address from circuitry, such as from the CPU interface 33 or the I/O interface 50 in response to corresponding signals produced by the microprocessor 22 or one of the I/O devices 38–46 (see FIG. 3). Typically, the Request is for a memory read or write operation, but may instead be a specialized operation used, for example, during computer system initialization. Each Request and associated Request Address is first stored in a request buffer or queue 52. Requests stored in the buffer 52 may then be reorganized or prioritized to optimize data transfer operation speed or other parameters, as is well known to those skilled in the art of multibank memory controller design.

The memory controller 28 includes a DRAM state machine 54 that receives a Request and associated Request Address from the request buffer 52 and produces the well-known control signal sets and sequences to initiate the corresponding memory access operations. The particular control signal types and protocols of the DRAM state machine 54 vary, depending on the particular multibank memory device types populating the main memory 30 (see FIG. 3). For an SDRAM, example control signals include the row address strobe (RAS), column address strobe (CAS), write enable (WE), and chip select (CS) signals. For an SLDRAM, example control signals include the packet-defined control/address signals that, for example, indicate device identification, command code, bank address, row address, and column address values. Details of the various control signals and protocols are well known to those skilled in the art and need not be described herein.

The memory controller 28 also includes refresh request circuitry 56. The refresh request circuitry 56 includes a refresh counter 58, which functions as a timer indicating the need for a next refresh operation. The refresh counter 58 selectively asserts a Refresh Request signal, and an address incrementer 60 provides the associated Refresh Address. Both the Request output by the request buffer 52 and the Refresh Request produced by the refresh counter 58 are provided to a request arbiter 62 that selectively passes one or the other of the requests to the DRAM state machine 54. The DRAM state machine 54 also receives the Refresh Address produced by the address incrementer 60, which address is then used by the DRAM state machine to produce the control signal sets and sequences to initiate memory refresh operations. As is known to those skilled in the art, reading data from a particular location in a DRAM necessarily refreshes the data stored at that location. Therefore, the refresh operations initiated by the DRAM state machine 54 can simply be the same as the control signal type and sequence associated with read operations.

Figure 5:
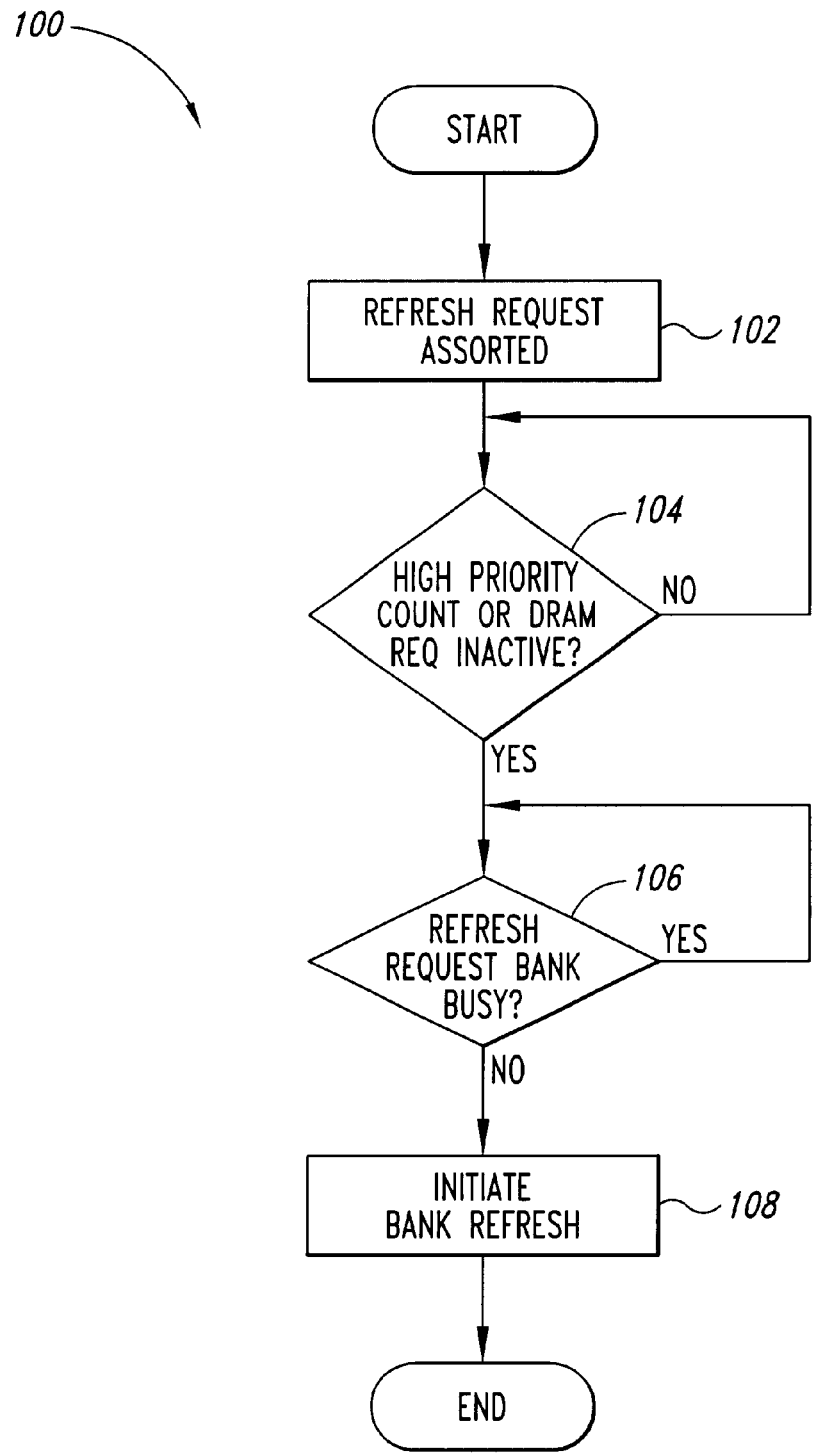
FIG. 5 is a process flow diagram depicting operations of the computer system and the memory controller of FIGS. 3 and 4.

FIG. 5 is a process flow diagram depicting operations of the computer system and memory controller of FIGS. 3 and 4—particularly, operations 100 for controlling a multibank memory device included in the main memory 30. Operations begin upon the refresh counter 58 asserting the Refresh Request signal at step 102. In step 104, the request arbiter 62 determines whether there is a pending Request stored in the request buffer 52 or whether the Refresh Request has an override priority. This determination can be accomplished with any of a number of suitable circuit components and according to well-known priority protocols. However, the currently preferred embodiment omits step 104 entirely, with an asserted Refresh Request being given priority over any Request stored in the request buffer 52. In step 106, it is determined whether the bank to which the Refresh Request is addressed is currently busy. This is done with standard bank conflict comparison circuitry, as is well understood by those skilled in the art of interleaved multibank memory controller design. Once it has been determined that the addressed bank is not busy, the DRAM state machine 54 then initiates refresh operations to that bank in step 108. The operations 100 then cease pending subsequent assertion of another Refresh Request by the refresh counter 58.

Figure 1:
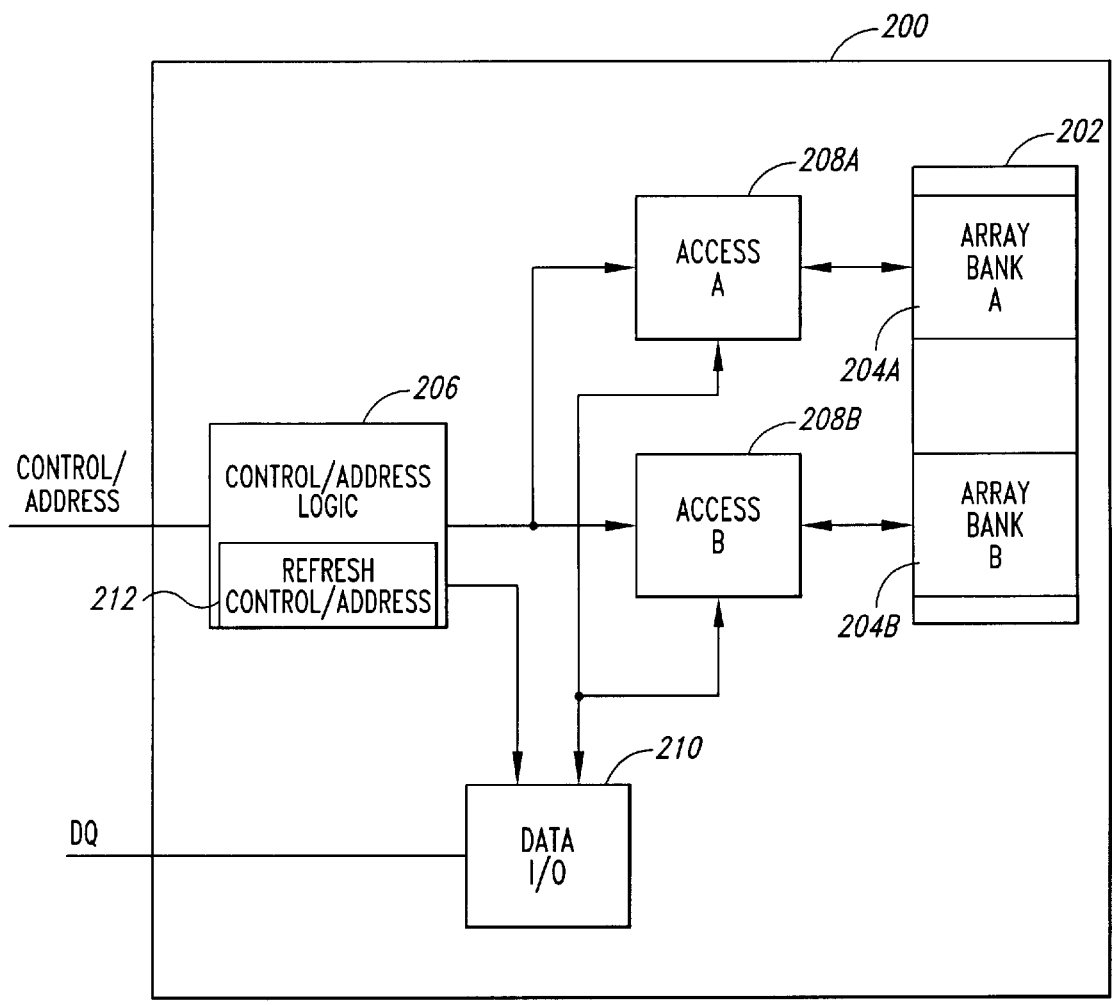
FIG. 1 is a functional block diagram depicting a memory device according to the prior art.
Figure 2:
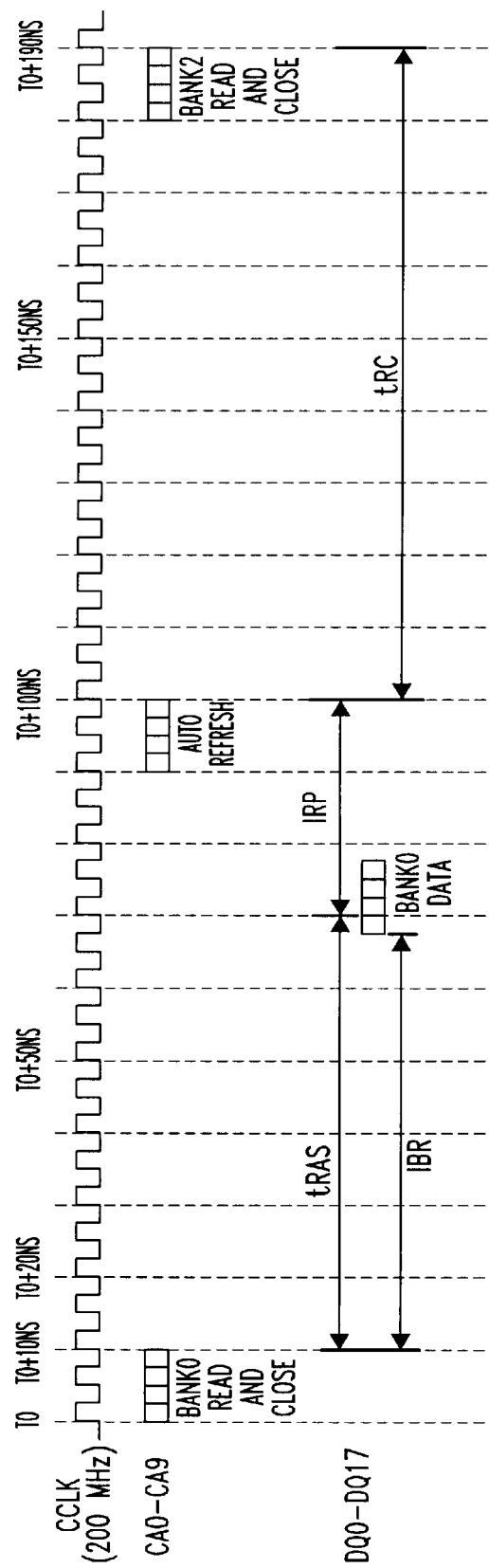
FIG. 2 is a timing diagram depicting SLDRAM operations according to the prior art.
Figure 6:
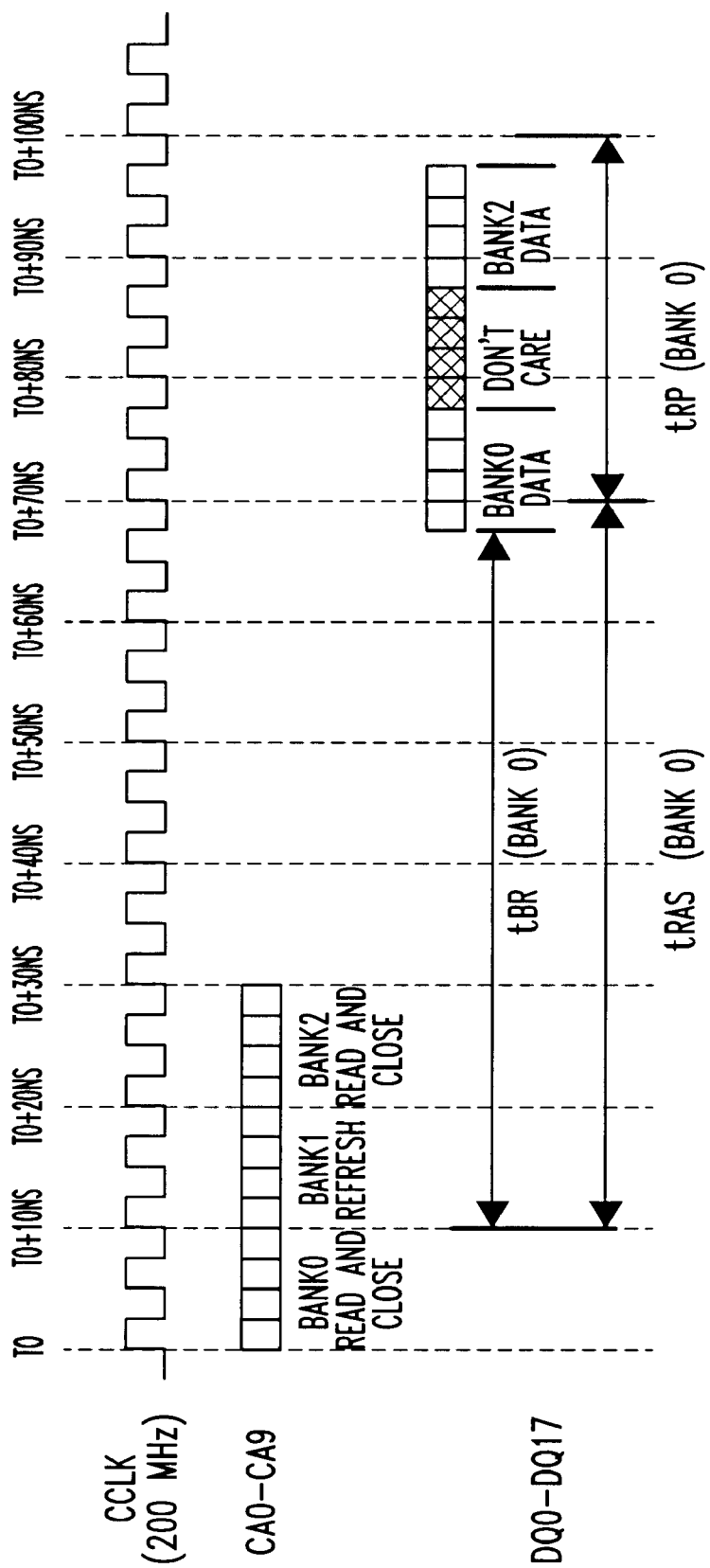
FIG. 6 is a timing diagram depicting operation of an SLDRAM by a memory controller in accordance with an embodiment of the present invention.

A number of advantages are provided by the above-described embodiments of the present invention. In particular, because the Refresh Request is passed to the DRAM state machine 54 (see FIG. 4) in the same way that a typical read or write request is passed, refresh operations can then be interleaved with other bank operations, without the refresh time penalties associated with conventional multibank memory controllers. Referring to FIG. 6, a timing diagram depicts refresh operations performed by an SLDRAM memory controller in accordance with an embodiment of the present invention. The time lapse between successive read operations shown in FIG. 6 stands in marked contrast to that of prior art FIG. 2. For example, the read command packet directed to a bank0, a refresh command packet directed to a bank1, and the read command packet directed to a bank2 can be registered without the idle time intervals shown in FIG. 2. Whereas the time interval between registration of the bank0 and bank2 commands in FIG. 2 is 180 nanoseconds, the present invention provides a time interval of merely 10 nanoseconds between these accesses. Refresh of the address location in bank1 can simply be accomplished by performing a bank1 read and close operation, with the associated data read from bank1 then being ignored by the memory controller 28.

Those skilled in the art will appreciate that the present invention may be accomplished with circuits other than those particularly depicted and described in connection with FIGS. 3 and 4. These figures represent just one of many possible implementations of a multibank memory controller in accordance with the present invention. Likewise, the present invention may be accomplished using process steps other than those particularly depicted and described in connection with FIG. 5. Those skilled in the art will also understand that each of the circuits whose function and interconnection are described in connection with FIGS. 3 and 4 is of a type known in the art. Therefore, one skilled in the art will be readily able to adapt such circuits in the described combination to practice the invention. Particular details of these circuits are not critical to the invention, and a detailed description of the internal circuit operation need not be provided. Similarly, each one of the process steps described in connection with FIG. 5 is of a type well known in the art, and may itself be a sequence of operations that need not be described in detail in order for one skilled in the art to practice the invention.

It will be appreciated that, although specific embodiments of the invention have been described for purposes of illustration, various modifications may be made without deviating from the spirit and scope of the invention. Those skilled in the art will appreciate that many of the advantages associated with these circuits and processes described above may be provided by other circuit configurations and processes. Indeed, a number of suitable circuit components can be adapted and combined in a variety of circuit topologies to implement multibank memory controllers in accordance with the present invention. Those skilled in the art will also appreciate that various terms used in the description above are sometimes used with somewhat different, albeit overlapping, meanings. For example, the term "bank" may refer solely to a memory array bank, or may refer both to an array bank and its associated access circuitry. The term "request" or "command" may refer solely to a request or command type (e.g., read or write), or may refer also to the associated address to which the request or command is directed. Therefore, terms used in the following claims shall be construed to include any of the various meanings known to those skilled in the art. Accordingly, the invention is not limited by the particular disclosure above, but instead the scope of the invention is determined by the following claims.

What is claimed is:

1. A computer system, comprising:

a processor;

a memory operable to store data having a plurality of memory banks; and a memory controller coupling the processor with the memory, the memory controller having a request arbiter circuit receiving pending data transfer requests and refresh requests, the request arbiter circuit operable to determine the order in which to selectively transmit the refresh or one of the pending data transfer;

a request queue circuit coupled to the request queue circuit, the request queue circuit storing a plurality of pending data transfer requests and providing data transfer request to the request;

a refresh request circuit coupled to the request arbiter circuit to provide refresh requests thereto; and a state machine circuit coupled to the request arbiter circuit to receive the selected refresh request or pending data transfer request and to produce a plurality of control signals to initiate a refresh operation direction to a first memory bank while a data transfer operation is being executed in a second memory bank.

2. A computer system according to claim 1 wherein the memory controller includes:

a timing circuit operable to substantially determine the time at which the refresh operation is initiated; and an address circuit operable to provide an address of a location in the first bank to which the refresh operation is directed.

3. A computer system according to claim 1 wherein the refresh request provided by the refresh request circuit includes an address of a location in the first bank to which the refresh operation is directed.

4. A computer system according to claim 1 wherein the memory is an SDRAM.

5. A computer system according to claim 1 wherein the memory is an SLDRAM.

6. A memory controller for controlling operations of a memory having a plurality of banks, comprising:

a request buffer operable to store a pending data transfer request;

a refresh requester operable to produce a refresh request; and a control state machine coupled with the request buffer and with the refresh requester, the control state machine operable to receive the data transfer request and to responsively apply a first plurality of control signals to the memory to initiate data transfer operations thereof, the control state machine also operable to receive the refresh request and to responsively apply a second plurality of control signals to the memory to initiate refresh operations thereof, the control state machine initiating refresh operations addressed to a first of the banks while data transfer operations are being executed in a second of the banks;

a request arbiter coupling the control state machine with the request buffer and with the refresh requester, the arbiter circuitry operable to determine which of the second data transfer and refresh requests to first provide to the control state machine.

7. A memory controller according to claim 6 wherein the data transfer request is a first data transfer request, and wherein the request buffer is operable to also store a second data transfer request.

8. A memory controller according to claim 6 wherein the refresh request produced by the refresh requester includes an address of a location in the first bank to which the refresh operations are addressed.

9. A memory controller according to claim 6 wherein the refresh requester includes a timing circuit operable to substantially determine the time at which the refresh operations are initiated.

10. A memory controller according to claim 6 wherein the refresh requester includes an address circuit operable to generate an address of a location in the first bank to which the refresh operations are addressed.

11. A memory controller for controlling operations of a multibank memory that registers commands and requires a minimum command time interval between successive registration of commands addressed to the same bank, the memory controller comprising:

request buffer circuitry operable to store a data transfer request;

refresh request circuitry operable to produce a refresh request; and control state circuitry coupled with the request buffer circuitry and with the refresh request circuitry, the control state circuitry operable to receive the data transfer request and to responsively register a data transfer command in the memory, the control state circuitry also operable to receive the refresh request and to responsively register a refresh command in the memory prior to elapse of the command time interval from registration of the data transfer command to initiate a refresh operation directed to a first memory bank while a data transfer operation is being executed in a second memory bank.

12. A memory controller according to claim 11 wherein the data transfer request is a first data transfer request, wherein the data transfer command is a first data transfer command, and wherein the request buffer circuitry is operable to also store a second data transfer request, the control state circuitry being operable to receive the second transfer request and responsively register a second data transfer command in the memory prior to elapse of the command time interval from registration of the first data transfer command.

13. A memory controller according to claim 12, further comprising arbiter circuitry coupling the control state circuitry with the request buffer circuitry and with the refresh request circuitry, the arbiter circuitry operable to determine which of the second data transfer and refresh requests to first provide to the control state circuitry.

14. A memory controller according to claim 11 wherein the refresh request produced by the refresh request circuitry includes a memory address to which the refresh command is directed.

15. A memory controller according to claim 11 wherein the refresh request circuitry includes a timing circuit operable to determine the time at which the refresh request is produced.

16. A memory controller according to claim 11 wherein the refresh request circuitry includes an address circuit operable to generate a memory address to which the refresh command is directed.

17. A memory controller for controlling operations of a memory having a plurality of banks, comprising:
   a request buffer operable to store a pending data transfer request;
   a refresh requester operable to produce a refresh request;
   a request arbiter coupled with the request buffer and with the refresh requester to receive the data transfer and refresh requests, the arbiter circuitry operable to determine the order in which the data transfer requests and the refresh requests are executed; and
   a control state machine coupled with the request arbiter, the control state machine operable to receive the data transfer request from the request arbiter and to responsively apply a first plurality of control signals to the memory to initiate data transfer operations thereof, the control state machine also operable to receive the refresh request from the request arbiter and to responsively apply a second plurality of control signals to the memory to initiate refresh operations thereof, the control state machine initiating refresh operations addressed to a first of the banks while data transfer operations are being executed in a second of the banks.

18. A memory controller according to claim 17 wherein the data transfer request is a first data transfer request, and wherein the request buffer is operable to also store a second data transfer request.

19. A memory controller according to claim 17 wherein the refresh request produced by the refresh requester includes an address of a location in the first bank to which the refresh operations are addressed.

20. A memory controller according to claim 17 wherein the refresh requester includes a timing circuit operable to substantially determine the time at which the refresh operations are initiated.

21. A memory controller according to claim 17 wherein the refresh requester includes an address circuit operable to generate an address of a location in the first bank to which the refresh operations are addressed.

22. A memory controller for controlling operations of a multibank memory that registers commands and requires a minimum command time interval between successive registration of commands aessed to the same bank, the memory controller comprising:
   request buffer circuitry operable to store a data transfer request;
   refresh request circuitry operable to produce a refresh request;
   control static circuitry operable to receive the data transfer request and to responsively register a data transfer command in the memory, the control state circuitry also operable to receive the refresh request and to responsively register a refresh command in the memory prior to elapse of the command time interval from registration of the data transfer command; and
   arbiter circuitry coupling the control state circuitry with the request buffer circuitry and with the refresh request circuitry to provide the control state circuitry data transfer requests and refresh request, the arbiter circuitry operable to determine the order in which to provide data transfer and refresh requests to the control state circuitry to initiate a refresh operation directed to a first memory bank while a data transfer operation is being executed in a second memory bank.

23. A memory controller according to claim 22 wherein the data transfer request is a first data transfer request, wherein the data transfer command is a first data transfer command, and wherein the request buffer circuitry is operable to also store a second data transfer request, the control state circuitry being operable to receive the second data transfer request and responsively register a second data transfer command in the memory prior to elapse of the command time interval from registration of the first data transfer command.

24. A memory controller according to claim 22 wherein the refresh request produced by the refresh request circuitry includes a memory address to which the refresh command is directed.

25. A memory controller according to claim 22 wherein the refresh request circuitry includes a timing circuit operable to determine the time at which the refresh request is produced.

26. A memory controller according to claim 22 wherein the refresh request circuitry includes an address circuit operable to generate a memory address to which the refresh command is directed.

* * * * *

UNITED STATES PATENT AND TRADEMARK OFFICE
CERTIFICATE OF CORRECTION

PATENT NO. : 6,298,413 B1  
DATED : October 2, 2001  
INVENTOR(S) : Leonard E. Christenson Page 1 of 1

It is certified that error appears in the above-identified patent and that said Letters Patent is hereby corrected as shown below:

Column 7,  
Line 21, reads "data having" should read -- data and having --  
Line 29, reads "refresh or" should read -- refresh request or --  
Line 39, reads "direction" should read -- directed --

Column 10,  
Line 2, reads "aessed" should read -- addressed --

Signed and Sealed this

Ninth Day of April, 2002

Attest:

Attesting Officer

JAMES E. ROGAN  
Director of the United States Patent and Trademark Office